United States Patent
Shibayama et al.

(10) Patent No.: US 11,579,527 B2
(45) Date of Patent: Feb. 14, 2023

(54) NEGATIVE TYPE PHOTOSENSITIVE COMPOSITION COMPRISING BLACK COLORANT

(71) Applicant: Merck Patent GmbH, Darmstadt (DE)

(72) Inventors: Seishi Shibayama, Kakegawa (JP); Daishi Yokohama, Kakegawa (JP); Atsuko Noya, Kakegawa (JP)

(73) Assignee: MERCK PATENT GMBH, Darmstadt (DE)

( * ) Notice: Subject to any disclaimer, the term of this patent is extended or adjusted under 35 U.S.C. 154(b) by 0 days.

(21) Appl. No.: 17/630,712

(22) PCT Filed: Jul. 29, 2020

(86) PCT No.: PCT/EP2020/071329
§ 371 (c)(1),
(2) Date: Jan. 27, 2022

(87) PCT Pub. No.: WO2021/018927
PCT Pub. Date: Feb. 4, 2021

(65) Prior Publication Data
US 2022/0260913 A1    Aug. 18, 2022

(30) Foreign Application Priority Data

Jul. 31, 2019   (JP) .............................. JP2019-141025

(51) Int. Cl.

| G03F 7/038 | (2006.01) |
|---|---|
| G03F 7/075 | (2006.01) |
| G03F 7/30 | (2006.01) |
| G03F 7/00 | (2006.01) |
| G03F 7/105 | (2006.01) |
| G03F 7/20 | (2006.01) |

(52) U.S. Cl.
CPC .......... *G03F 7/0388* (2013.01); *G03F 7/0007* (2013.01); *G03F 7/0758* (2013.01); *G03F 7/105* (2013.01); *G03F 7/20* (2013.01)

(58) Field of Classification Search
CPC .... G03F 7/0757; G03F 7/0758; G03F 7/0388; G03F 7/0007; G03F 7/30
See application file for complete search history.

(56) References Cited

U.S. PATENT DOCUMENTS

| 2019/0072851 A1* | 3/2019 | Tanigaki ................... G03F 7/16 |
| 2019/0382617 A1* | 12/2019 | Kim ........................ C08K 3/04 |
| 2020/0156943 A1 | 5/2020 | Kageyama et al. |
| 2021/0115219 A1 | 4/2021 | Inoue et al. |

FOREIGN PATENT DOCUMENTS

| EP | 1722272 A1 | 11/2006 |
| JP | 2018-009194 A | 1/2018 |
| JP | 2018-203599 A | 12/2018 |
| KR | 2011-0027079 A | 3/2011 |
| WO | 2013/115268 A1 | 8/2013 |
| WO | 2019/059359 A1 | 3/2019 |
| WO | 2019/069609 A1 | 4/2019 |

OTHER PUBLICATIONS

International Search Report and Written Opinion received for PCT Patent Application No. PCT/EP2020/071329, dated Oct. 27, 2020, 9 pages.

* cited by examiner

*Primary Examiner* — John S Chu
(74) *Attorney, Agent, or Firm* — Faegre Drinker Biddle & Reath LLP

(57) ABSTRACT

[Problem] To provide a negative type photosensitive composition which is capable of forming a cured film having high resolution and high light shielding properties. [Means for Solution] A negative type photosensitive composition comprising (I) an alkali-soluble resin, (II) a black colorant, (III) a polymerization initiator, and (IV) a solvent, wherein the black colorant (II) has a transmittance ratio represented by [transmittance at the wavelength of 365 nm]/[transmittance at the wavelength of 500 nm] of 1.2 more.

11 Claims, No Drawings

NEGATIVE TYPE PHOTOSENSITIVE COMPOSITION COMPRISING BLACK COLORANT

CROSS-REFERENCE TO RELATED APPLICATIONS

This application is a national stage application (under 35 U.S.C. § 371) of PCT/EP2020/071329, filed Jul. 29, 2020, which claims benefit of Japanese Application No. 2019-141025, filed Jul. 31, 2019, both of which are incorporated herein by reference in their entirety.

BACKGROUND OF THE INVENTION

Technical Field

The present invention relates to a negative type photosensitive composition comprising a black colorant. Further, the present invention relates also to a method for producing a cured film using the same, a cured film formed therefrom, and a display device comprising the cured film.

Background Art

A black matrix for a color filter used in a color display device is formed by dispersing a light shielding black pigment such as carbon black in an alkali-soluble resin to form a resist composition, applying it, exposing and developing, and patterning. The black matrix is used, for example, in a liquid crystal display device to prevent light leakage between pixels which do not carry out switching and to maintain high contrast. In addition, since leakage current due to photo-excitation occurs when an amorphous silicon or an oxide semiconductor is exposed to light, leakage current is suppressed by blocking the light to thin film transistor portion with a black matrix layer.

When a resist composition containing the black pigment as described above is used, the black pigment absorbs light during exposure, light does not reach the bottom of the resist film, and adversely affects patterning, and therefore, such a composition is hard to achieve higher resolution compared with usual one. A material capable of achieving a thicker film is required as a bank structure forming material of a display device. However, when a resist composition containing a black pigment is used for making a thick film, influence of the absorption by the black pigment becomes more than that of a thin film.

In addition, in consideration of environmental load, a composition that can be developed with a low-concentration alkaline developer other than an organic developer has been desired to be created.

PRIOR ART DOCUMENTS

Patent Documents

[Patent document 1] JP-A 2018-203599

SUMMARY OF THE INVENTION

Problems to be Solved by the Invention

The present invention has been made in view of the above-described circumstances, and its object is to provide a negative type photosensitive composition which is capable of forming a cured film having high resolution and excellent light shielding properties.

Means for Solving the Problems

The negative type photosensitive composition according to the present invention comprises
(I) an alkali-soluble resin,
(II) a black colorant,
(III) a polymerization initiator, and
(IV) a solvent,
wherein the black colorant (II) has a transmittance ratio represented by [transmittance at the wavelength of 365 nm]/[transmittance at the wavelength of 500 nm] of 1.2 or more.

The method for producing a cured film according to the present invention comprises applying the above-described composition onto a substrate to form a coating film, exposing the coating film, and developing.

The cured film according to the present invention is produced by the above method.

The display device according to the present invention is one comprising the above cured film.

Effects of the Invention

The negative type photosensitive composition according to the present invention can form a cured film having high resolution and excellent light shielding properties. Furthermore, the negative type photosensitive composition according to the present invention can be developed even with a low-concentration alkaline developer other than an organic developer and is excellent also in environmental properties.

DETAILED DESCRIPTION OF THE INVENTION

Mode for Carrying Out the Invention

Embodiments of the present invention are described below in detail.

In the present specification, symbols, units, abbreviations, and terms have the following meanings unless otherwise specified.

In the present specification, unless otherwise specifically mentioned, the singular form includes the plural form and "one" or "that" means "at least one". In the present specification, unless otherwise specifically mentioned, an element of a concept can be expressed by a plurality of species, and when the amount (for example, mass % or mol %) is described, it means sum of the plurality of species. "And/or" includes a combination of all elements and also includes single use of the element.

In the present specification, when a numerical range is indicated using "to" or "–", it includes both endpoints and units thereof are common. For example, 5 to 25 mol % means 5 mol % or more and 25 mol % or less.

In the present specification, the hydrocarbon means one including carbon and hydrogen, and optionally including oxygen or nitrogen. The hydrocarbyl group means a monovalent or divalent or higher valent hydrocarbon. In the present specification, the aliphatic hydrocarbon means a linear, branched or cyclic aliphatic hydrocarbon, and the aliphatic hydrocarbon group means a monovalent or divalent or higher valent aliphatic hydrocarbon. The aromatic hydrocarbon means a hydrocarbon comprising an aromatic ring which may optionally not only comprise an aliphatic hydrocarbon group as a substituent but also be condensed with an alicycle. The aromatic hydrocarbon group means a monovalent or divalent or higher valent aromatic hydrocarbon. Further, the aromatic ring means a hydrocarbon comprising a conjugated unsaturated ring structure, and the alicycle means a hydrocarbon having a ring structure but comprising no conjugated unsaturated ring structure.

In the present specification, the alkyl means a group obtained by removing any one hydrogen from a linear or branched, saturated hydrocarbon and includes a linear alkyl and branched alkyl, and the cycloalkyl means a group obtained by removing one hydrogen from a saturated hydrocarbon comprising a cyclic structure and optionally includes a linear or branched alkyl in the cyclic structure as a side chain.

In the present specification, the aryl means a group obtained by removing any one hydrogen from an aromatic hydrocarbon. The alkylene means a group obtained by removing any two hydrogens from a linear or branched, saturated hydrocarbon. The arylene means a hydrocarbon group obtained by removing any two hydrogens from an aromatic hydrocarbon.

In the present specification, the descriptions such as "$C_{x-y}$", "$C_x$-$C_y$" and "$C_x$" mean the number of carbons in the molecule or substituent group. For example, $C_{1-6}$ alkyl means alkyl having 1 to 6 carbons (such as methyl, ethyl, propyl, butyl, pentyl and hexyl). Further, the fluoroalkyl as used in the present specification refers to one in which one or more hydrogen in alkyl is replaced with fluorine, and the fluoroaryl is one in which one or more hydrogen in aryl are replaced with fluorine.

In the present specification, when polymer has a plural types of repeating units, these repeating units copolymerize. These copolymerization are any of alternating copolymerization, random copolymerization, block copolymerization, graft copolymerization, or a mixture of any of these.

In the present specification, "%" represents mass % and "ratio" represents ratio by mass.

In the present specification, Celsius is used as the temperature unit. For example, 20 degrees means 20 degrees Celsius.

Negative Type Photosensitive Composition

The negative type photosensitive composition according to the present invention (hereinafter sometimes referred to as the composition) comprises (I) an alkali-soluble resin, (II) a specific black colorant, (III) a polymerization initiator, and (IV) a solvent. Hereinafter, each component contained in the composition according to the present invention is described in detail.

The composition according to the present invention is a negative type photosensitive composition for a thick film which exhibits effects as long as it is a film having a thickness of 100 μm or less, but exhibits further effects when a thick film is formed. Here, in the present invention, the thick film means a film having an average film thickness of 5 to 100 μm (preferably 5 to 25 μm, more preferably 8 to 20 μm). In the present invention, the average film thickness is determined by measuring the film thicknesses at 3 to 5 points using a stylus type surface profile measuring instrument of ULBAC to calculate an average value of them.

The viscosity of the composition according to the present invention is preferably 0.1 to 10,000 cP, more preferably 1.0 to 8,000 cP. Here, the viscosity is measured at 25° C. using a rotational viscometer.

(I) Alkali-Soluble Resin

The composition according to the present invention comprises an alkali-soluble resin.

The alkali-soluble resin used in the present invention preferably comprises an acryloyl group. Further, the alkali-soluble resin used in the present invention is not particularly limited, and is preferably selected from a polysiloxane containing a siloxane bond in its main skeleton, and an acrylic resin. Among them, it is more preferable to use a polysiloxane from the viewpoints of the dispersibility of the black colorant and heat resistance.

The alkali-soluble resin used in the present invention can have a carboxyl group. By having a carboxyl group, the solubility of the alkali-soluble resin in a low-concentration developer can be improved.

(Polysiloxane)

The alkali-soluble resin preferably contains a siloxane (Si—O—Si) bond as its main skeleton. In the present invention, polymer containing a siloxane bond as its main skeleton is referred to as polysiloxane. Depending on the number of the oxygen atoms bonded to a silicon atom, the skeleton structure of polysiloxane can be classified as follows: a silicone skeleton (the number of oxygen atoms bonded to a silicon atom is 2), a silsesquioxane skeleton (the number of oxygen atoms bonded to a silicon atom is 3), and a silica skeleton (the number of oxygen atoms bonded to a silicon atom is 4). In the present invention, any of these can be used. The polysiloxane molecule can contain a combination of a plurality of these skeletal structures. Preferably, polysiloxane used in the present invention contains a silsesquioxane skeleton.

Polysiloxane generally has a silanol group or an alkoxysilyl group. Such silanol group and alkoxysilyl group mean a hydroxyl group and alkoxy group directly bonded to a silicon that forms a siloxane skeleton. Here, the silanol group and alkoxysilyl group are considered to contribute to the reaction with the silicon-containing compound described below, in addition to the action of accelerating the curing reaction when forming a cured film using the composition. For this reason, it is preferable that polysiloxane has these groups.

The polysiloxane used in the present invention preferably comprises a repeating unit represented by the formula (Ia'):

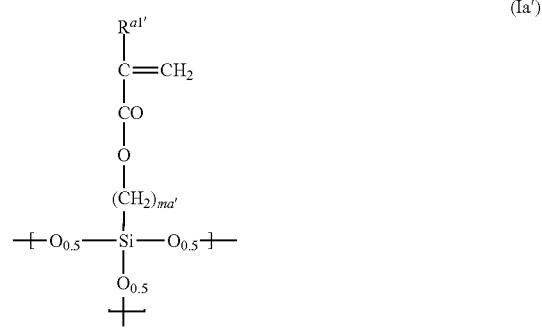

(wherein, $R^{a1'}$ is hydrogen or methyl; and ma' is each independently an integer of 1 to 6, preferably an integer of 1 to 3, and most preferably 3).

As described below, the polysiloxane containing a repeating unit represented by the formula (Ia) is obtained by (1) reacting an acryloyl group-containing silane monomer to obtain an acryloyl group-containing polysiloxane and (2) cleaving the double bond between carbon atoms in the obtained acryloyl group-containing polysiloxane and polymerizing it. In this process (2), when unreacted acryloyl groups remain, polysiloxane having a repeating unit represented by the formula (Ia') is obtained. Polysiloxane obtained only in process (1) without performing the process (2) is also one aspect of the present invention. That is, polysiloxane which contains no repeating unit of the formula (Ia) but contains the repeating unit of the formula (Ia') is also a suitable aspect.

Preferably, the polysiloxane used in the present invention comprises a repeating unit represented by the formula (Ia):

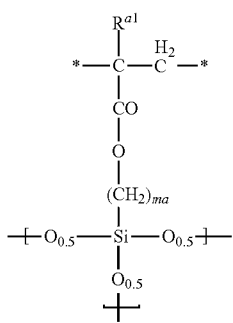

(Ia)

(wherein, $R^{a1}$ is hydrogen or methyl; and ma is each independently an integer of 1 to 6, preferably an integer of 1 to 3, and most preferably 3), and an acrylic polymerization unit represented by the formula (a):

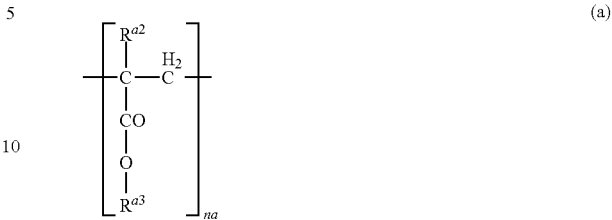

(a)

(wherein, $R^{a2}$ is each independently hydrogen or methyl;

$R^{a3}$ is hydrogen, a monovalent to hexavalent, $C_{1-50}$ hydrocarbon group, wherein one or more methylene in the hydrocarbon group can be replaced by oxy, imino and/or carbonyl, and when $R^{a3}$ is multivalent, $R^{a3}$ connects carbonyloxy in the formula (a) with carbonyloxy contained in another repeating unit represented by the formula (a); and na is an integer of 0 or more), and wherein,

* of at least one repeating unit in the formula (Ia) is connected, directly or via an acrylic polymerization unit represented by the formula (a), to * of another repeating unit represented by the formula (Ia).

In the acrylic polymerization unit represented by the formula (a), the formula (a) can be combined with another formula (a) to form a block, but when the acrylic polymerization unit is many, heat resistance tends to decrease. Therefore, in one molecule of polysiloxane, the sum of na/(the number of the repeating units represented by (Ia)+the sum of na) is preferably 0.15 or less, more preferably 0.05 or less.

na is not particularly limited as long as it satisfies the above, but is preferably 0 to 6, more preferably 0 to 4, and still more preferably 1 to 2. When a plurality of (a) are contained, each na can be identical or different.

$R^{a3}$ is preferably hydrogen or $C_{1-30}$ hydrocarbon group, more preferably hydrogen or $C_{1-20}$ hydrocarbon group, since heat resistance tends to decrease when the number of carbon atoms is large.

The acrylic polymerization unit represented by the formula (a) is not essential, but is preferably contained for improving the adhesion.

$R^{a3}$ includes, for example, the followings:

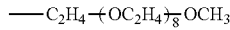

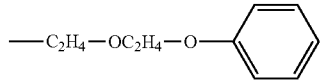

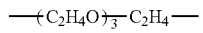

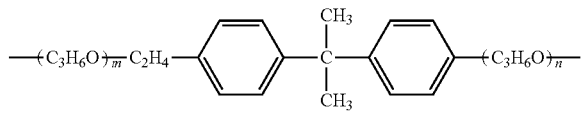

-continued

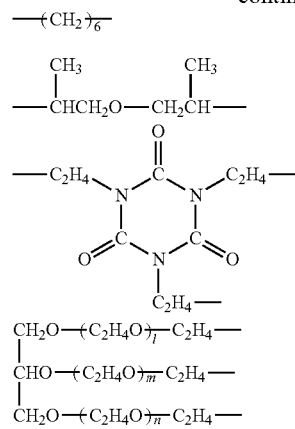

$l + m + n = 6$

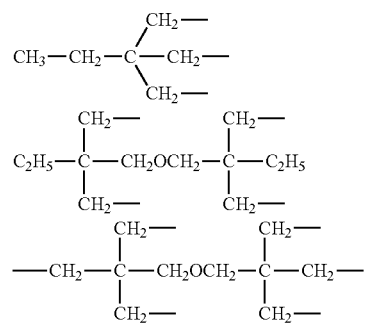

Among the above, hydrogen, tris-(2-acryloxyethyl) isocyanurate and dipentaerythritol hexaacrylate are preferred.

When the repeating unit represented by the formula (a) is a group derived from an acrylic compound containing a plurality of double bonds, it is preferable that some of the double bonds remain without being cleaved.

The polymerization unit represented by the formula (a) can be an acrylic polimerization unit, in which $R^{a3}$ is a group obtained by removing a plurality of, preferbly two or three of hydrogen atoms, from a nitrogen- and/or oxygen-containing alicyclic hydrocarbon compound containing a hydrocarbon group substituted with an amino group, an imino group and/or a carbonyl group (a group obtained by removing two or three hydrogens, preferably from a nitrogen-containing aliphatic hydrocarbon ring containing an imino group and/or a carbonyl group, more preferably from a 5-membered ring or a 6-membered ring containing nitrogen as a member, and most preferably from a piperidine derivative, a pyrrolidine derivative, or an isocyanurate derivative).

Since the heat resistance is lowered when the mixing ratio of the repeating units represented by the formulae (Ia) and (Ia') is high, it is preferably 10 to 100 mol % based on the total number of the repeating units of polysiloxane.

In the present specification, "based on the total number of the repeating units of polysiloxane" means the total number of the siloxane repeating units of polysiloxane and, for example, the acrylic polymerization unit represented by the formula (a) is not be included in this total number.

The polysiloxane according to the present invention preferably contains a repeating unit represented by the formula (Ib):

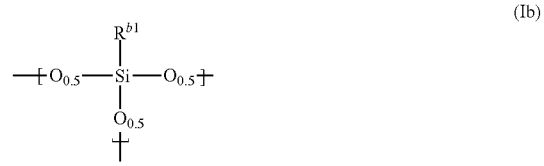

(wherein,
$R^{b1}$ represents hydrogen, a $C_{1-30}$, linear, branched or cyclic, saturated or unsaturated, aliphatic hydrocarbon group or aromatic hydrocarbon group,
the aliphatic hydrocarbon group and the aromatic hydrocarbon group can be each substituted with fluorine, hydroxy, alkoxy, aldehyde (—CHO), carboxyl or —COOR' (where R' is alkyl having 1 to 8 carbon atoms), and
one or more methylene in the aliphatic hydrocarbon group and the aromatic hydrocarbon group can be replaced with oxy or imino, provided that $R^{b1}$ is neither hydroxy nor alkoxy).

In addition, here, the above-described methylene group includes terminal methyl.

Further, the above "can be substituted with fluorine, hydroxy, alkoxy, aldehyde, carboxyl or —COOR'" means that a hydrogen atom directly bonded to a carbon atom in an aliphatic hydrocarbon group or an aromatic hydrocarbon group can be replaced with fluorine, hydroxy, alkoxy, aldehyde, carboxyl or —COOR'. In the present specification, the same applies to other similar descriptions.

In the repeating unit represented by the formula (Ib), examples of $R^{b1}$ include (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl and 3,3,3-trifluoropropyl, (iv) fluoroaryl, (v) cycloalkyl, such as cyclohexyl, (vi) a nitrogen-containing group having an amino or imide structure, such as isocyanate and amino, (vii) an oxygen-containing group having an epoxy structure, such as glycidyl, and (viii) a carboxyl-containing group, such as carboxymethyl and dicarboxyl. Preferred are methyl, ethyl, propyl, butyl, pentyl, hexyl, phenyl, tolyl, glycidyl and isocyanate. As fluoroalkyl, perfluoroalkyl is preferred, and particularly trifluoromethyl and pentafluoroethyl are preferred. It is preferable that $R^{b1}$ is methyl, because the raw material is easy to obtain, the film hardness after cured is high, and the chemical resistance is high. Further, it is preferable that $R^{b1}$ is phenyl, because the solubility of the polysiloxane in the solvent is increased and the cured film is less likely to crack. Further, it is preferable that $R^{b1}$ has hydroxy, glycidyl, isocyanate or amino, because the adhesion to the substrate is improved.

Examples of the polysiloxane used in the present invention include those comprising the following structures:

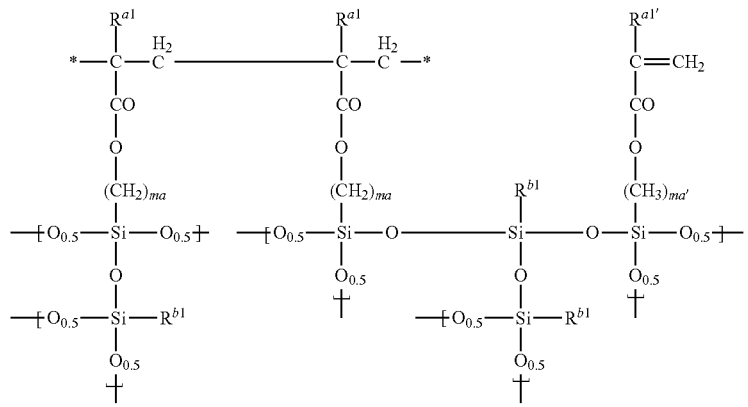

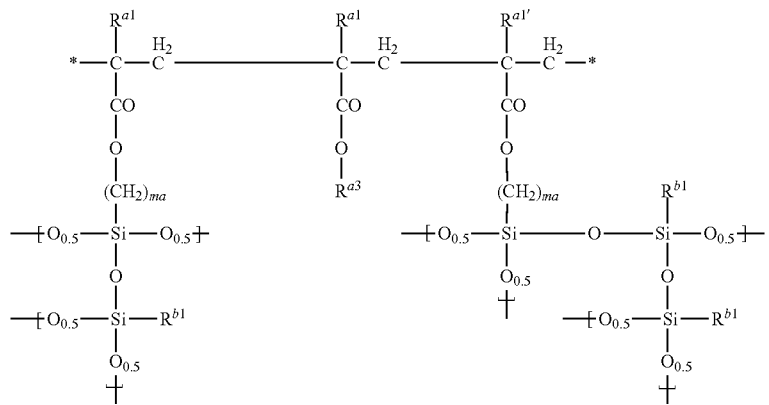

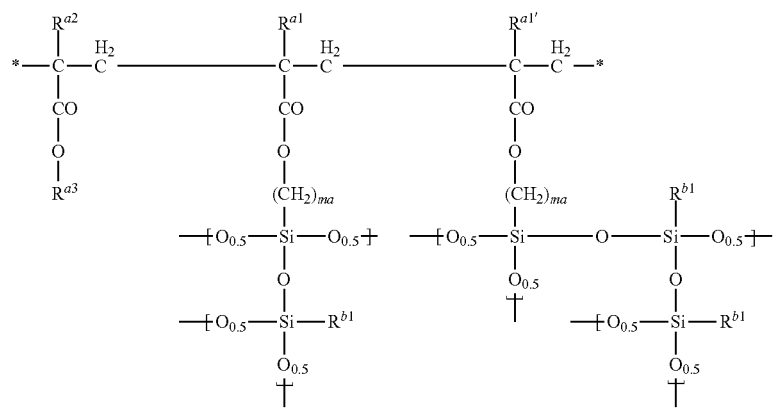

Since the strength and heat resistance of the formed cured film are increased but the adhesion is reduced, when the mixing ratio of the repeating unit represented by the formula (Ib) is high, it is preferably 0 to 90 mol % based on the total number of the repeating units of polysiloxane.

The polysiloxane used in the present invention preferably comprises a repeating unit represented by the formula (Ic):

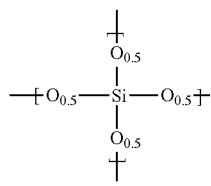
(Ic)

The polysiloxane used in the present invention can comprise a repeating unit represented by the formula (Id):

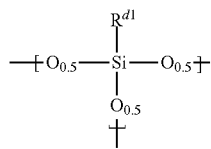
(Id)

wherein,
$R^{d1}$ is a group obtained by removing a plurality of hydrogens from a nitrogen- and/or oxygen-containing alicyclic hydrocarbon compound containing an amino group, an imino group and/or a carbonyl group. Here, the alicyclic hydrocarbon compound have a cyclic structure and can optionally includes a linear or branched structure.

In the formula (Id), $R^{d1}$ is preferably a group obtained by removing a plurality of, preferbly two or three of hydrogen atoms, preferably from a nitrogen-containing aliphatic hydrocarbon compound containing an imino group and/or a carbonyl group, and more preferably from a 5-membered ring or a 6-membered ring containing nitrogen as a member. For example, a group obtained by removing two or three hydrogens from piperidine, pyrrolidine and isocyanurate can be mentioned. The group that is not bonded to oxygen in the formula (Id) connects each Si included in a plurality of repeating units.

Since photosensitivity of the composition decrease, and cracks easily occur due to decrease of the compatibility with solvents and additives and increase of the film stress when the mixing ratio of the repeating units represented by the formulae (Id) and (Ic) is high, it is preferably 40 mol % or less, more preferably 20 mol % or less, based on the total number of the repeating units of polysiloxane.

The polysiloxane used in the present invention can comprise a repeating unit represented by the formula (Ie):

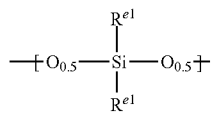
(Ie)

wherein,
$R^{e1}$ each independently represents hydrogen, a $C_{1-30}$, linear, branched or cyclic, saturated or unsaturated, aliphatic hydrocarbon group, or an aromatic hydrocarbon group, the aliphatic hydrocarbon group and the aromatic hydrocarbon group can be substituted with fluorine, hydroxy or alkoxy, and methylene in the aliphatic hydrocarbon group and the aromatic hydrocarbon group can be replaced with oxy or imino, provided that $R^{e1}$ is neither hydroxy nor alkoxy. Here, the above-described methylene group includes terminal methyl.

In the repeating unit represented by the formula (Ie), examples of $R^{e1}$ include (i) alkyl, such as methyl, ethyl, propyl, butyl, pentyl, hexyl, heptyl, octyl and decyl, (ii) aryl, such as phenyl, tolyl and benzyl, (iii) fluoroalkyl, such as trifluoromethyl, 2,2,2-trifluoroethyl and 3,3,3-trifluoropropyl, (iv) fluoroaryl, (v) cycloalkyl, such as cyclohexyl, (vi) a nitrogen-containing group having an amino or imide structure, such as isocyanate and amino, and (vii) an oxygen-containing group having an epoxy structure, such as glycidyl. Preferred are methyl, ethyl, propyl, butyl, pentyl, hexyl, phenyl, tolyl, glycidyl and isocyanate. As fluoroalkyl, perfluoroalkyl is preferred, and particularly trifluoromethyl and pentafluoroethyl are preferred. It is preferable that $R^{e1}$ is methyl, because the raw material is easy to obtain, the film hardness after cured is high, and the chemical resistance is high. Further, it is preferable that $R^{e1}$ is phenyl, because the solubility of the polysiloxane in the solvent is increased and the cured film is less likely to crack. Further, it is preferable that $R^{e1}$ has hydroxy, glycidyl, isocyanate or amino, because the adhesion to the substrate is improved.

Through having the repeating unit represented by the above formula (Ie), the polysiloxane used in the present invention can partially have a linear structure. However, since the heat resistance is reduced, it is preferable that the linear structure portion is less. Specifically, the repeating unit represented by the formula (Ie) is preferably 30 mol % or less based on the total number of the repeating units of polysiloxane.

The polysiloxane used in the present invention has a structure in which repeating units as described above and blocks are bonded, but preferably has silanol at its terminal. Such a silanol group is obtained by bonding —O$_{0.5}$H to a bond of the above-described repeating unit or block.

The mass average molecular weight of the polysiloxane used in the present invention is not particularly limited. However, the higher the molecular weight is, the more the coating properties tend to be improved. On the other hand, the lower the molecular weight is, the less the synthesis conditions are limited and the easier the synthesis is, and it is difficult to synthesize polysiloxane having a very high molecular weight. For these reasons, the mass average molecular weight of polysiloxane is usually 1,500 to 20,000, and preferably 2,000 to 15,000 in view of the solubility in an organic solvent and the solubility in an alkali developer. Here, the mass average molecular weight is a mass average molecular weight in terms of polystyrene, which can be measured by gel permeation chromatography based on polystyrene.

The polysiloxane used in the present invention can be a mixture in which polysiloxane containing repeating units represented by (Ia) and/or (Ia') is combined with polysiloxane containing any of the repeating units represented by (Ib) to (Ie) and containing no repeating units represented by (Ia) and/or (Ia').

The polysiloxane comprising (Ia) can be obtained, for example, by the following processes:
(1) hydrolyzing and polymerizing a silane monomer represented by the formula (ia):

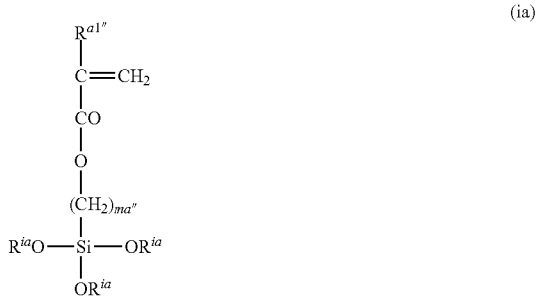
(ia)

(wherein,
$R^{a1''}$ is hydrogen or methyl;
ma" is an integer of 1 to 6, preferably an integer of 1 to 3, most preferably 3; and
$R^{ia}$ is a linear or branched, $C_{1-6}$ alkyl) or a mixture thereof optionally in the presence of an acidic catalyst or a basic catalyst to obtain an acryloyl group-containing polysiloxane, and
(2) cleaving the double bond between carbon atoms in the obtained acryloyl group-containing polysiloxane and polymerizing it.

Here, the above-described mixture can be a mixture comprising a silane monomer represented by the formula (ia) combined with a silane monomer represented by another formula (ia), silane monomers represented by the following formulae (ib) to (ie), or a compound other than silane monomer.

The polysiloxane obtained by the above-described processes is to give a composition that exhibits excellent properties, and the obtained structure includes, for example, those exemplified above. However, it is thought that structures other than the above exemplified ones can be taken, since various structures can be taken depending on the type and the mixing ratio of the monomer.

[Process (1)]

In the formula (ia), preferred $R^{ia}$ includes methyl, ethyl, n-propyl, isopropyl, n-butyl, and the like. In the formula (ia), a plurality of $R^{ia}$ are included, and each $R^{ia}$ can be identical or different.

With the silane represented by the formula (ia), a silane monomer represented by the formula (ib) is preferably further combined:

(ib)

(wherein,
$R^{b1'}$ represents hydrogen, a $C_{1-30}$, linear, branched or cyclic, saturated or unsaturated, aliphatic hydrocarbon group, or an aromatic hydrocarbon group,
the aliphatic hydrocarbon group and the aromatic hydrocarbon group can be substituted with fluorine, hydroxy, alkoxy, aldehyde (—CHO), carboxyl or —COOR' (where R' is alkyl having 1 to 8 carbon atoms),
methylene in the aliphatic hydrocarbon group and the aromatic hydrocarbon group can be replaced with oxy or imino, provided that $R^{b1'}$ is neither hydroxy nor alkoxy, and $R^{b1}$ is a linear or branched, $C_{1-30}$ alkyl).

In the formula (ib), preferred $R^{b1'}$ is the same as the preferred $R^{b1}$ described above. Preferred $R^{ib}$ includes methyl, ethyl, n-propyl, isopropyl, n-butyl, and the like.

Exemplified embodiments of the silane monomer represented by the formula (ib) include, for example, methyltrimethoxysilane, methyltriethoxysilane, methyltriisopropoxysilane, methyltri-n-butoxysilane, ethyltrimethoxysilane, ethyltriethoxysilane, ethyltriisopropoxysilane, ethyltri-n-butoxysilane, n-propyltrimethoxysilane, n-propyltriethoxysilane, n-butyltrimethoxysilane, n-butyltriethoxysilane, n-hexyltrimethoxysilane, n-hexyltriethoxysilane, decyltrimethoxysilane, phenyltrimethoxysilane, phenyltriethoxysilane, trifluoromethyltrimethoxysilane, trifluoromethyltriethoxysilane, 3,3,3-trifluoropropyltrimethoxysilane. Among them, methyltrimethoxysilane, methyltriethoxysilane, methyltripropoxysilane, and phenyltrimethoxysilane are preferable. The silane monomer represented by the formula (ib) can be used in combination of two or more.

An acrylic-polymerized polysiloxane can also be obtained by combining silane monomers represented by the above formulae (ia) and/or (ib) further with the silane monomers represented by the following formulae (ic) and/or (id). In this way, when the silane monomers represented by the formulae (ic) and/or the formula (id) are used, polysiloxane containing the repeating units (Ic) and/or (Id) can be obtained.

(ic)

(id)

wherein,
$R^{ic}$ and $R^{id}$ are each independently a lenear or branched, $C_{1-6}$ alkyl, and examples thereof include methyl, ethyl, n-propyl, isopropyl, n-butyl, and the like. A plurality of $R^{ic}$ and $R^{id}$ are contained in one monomer, but each $R^{ic}$ and $R^{id}$ can be identical or different,
$R^{d1'}$ is a group obtained by removing a plurality of hydrogens from a nitrogen- and/or oxygen-containing alicyclic hydrocarbon compound containing an amino group, an imino group and/or a carbonyl group. Preferred $R^{d1'}$ is the same as the preferred $R^{d1}$ described above.

Exemplified embodiments of the silane monomer represented by the formula (ic) include tetramethoxysilane, tetraethoxysilane, tetraisopropoxysilane, tetra-n-butoxy-silane, and the like.

Exemplified embodiments of the silane monomer represented by the formula (id) include tris-(3-trimethoxysilylpropyl) isocyanurate, tris-(3-triethoxy-silylpropyl) isocyanurate, tris-(3-trimethoxysilylethyl) isocyanurate, and the like.

Furthermore, a silane monomer represented by the following formula (ie) can be combined. When the silane monomer represented by the formula (ie) is used, polysiloxane containing the repeating unit (Ie) can be obtained.

(ie)

wherein,
$R^{ie}$ is each independently a linear or branched, $C_{1-6}$ alkyl, and examples thereof include methyl, ethyl, n-propyl, isopropyl, n-butyl, and the like. A plurality of $R^{ie}$ are contained in one monomer, and each $R^{id'}$ can be identical or different,
$R^{e1'}$ each independently represents hydrogen, a $C_{1-30}$, linear, branched or cyclic, saturated or unsaturated, aliphatic hydrocarbon group, or an aromatic hydrocarbon group, the aliphatic hydrocarbon group and the aromatic hydrocarbon group can be substituted with fluorine, hydroxy or alkoxy, and methylene in the aliphatic hydrocarbon group and the aromatic hydrocarbon group can be replaced with oxy or imino, provided that $R^{e1'}$ is neither hydroxy nor alkoxy. Preferred $R^{e1'}$ is the same as the preferred $R^{e1}$ as described above.

Exemplified embodiments of the silane monomer represented by the formula (ie) include dimethyldiethoxysilane, diphenyldimethoxysilane, and the like.

[Process (2)]

In the process (2), the double bond between carbon atoms of the acryloyl group in the obtained acryloyl group-containing polysiloxane is cleaved and polymerized.

In this reaction, as a polymerization initiator, for example, azo-based initiators, such as 2,2'-azabisisobutyronitrile, 2,2'-azobis (2,4-dimethylvaleronitrile), 2,2'-azobis (2-methyl butyronitrile), 4,4'-azobis (4-cyanovaleric acid), 2,2'-azobis (2-methylpropionamidine) dihydrochloride, 2,2'-azobis [2-(2-imidazoline-2-yl)propane] dihydrochloride and 2,2'-azobis (2-methylpropionate) dimethyl; and peroxide-based initiators, such as dibenzoyl peroxide, tert-butyl hydroperoxide (70% aqueous solution), α,α-dimethylbenzyl hydroperoxide, tert-butyl peroxide and bis (1-methyl-1-phenylethyl) peroxide are preferably used. The double bond between carbon atoms of the acryloyl group is cleaved and polymerized, but a part thereof can remain without being cleaved and polymerized. When polymerized, it contributes to low-concentration development, and when not polymerized, it has the effect of accelerating the curing by an acrylic reaction.

The content of the polymerization initiator is not particularly limited, but is preferably 0.1 to 500 mol % based on the number of acrylic functional groups.

In the process (2), the polymerization reaction can be carried out in the coexistence of an acrylate monomer represented by the formula (a'):

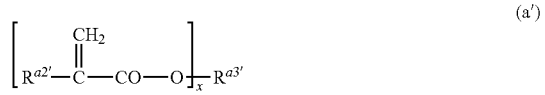

(wherein,
$R^{a2'}$ is hydrogen or methyl;
$R^{a3'}$ is a $C_{1-50}$ hydrocarbon group, wherein one or more methylene in the hydrocarbon group can be replaced with oxy, imino and/or carbonyl, and preferred $R^{a3'}$ is the same as the preferred $R^{a3}$ described above, and
X is an integer of 1 to 6, preferably an integer of 3 to 6.)

The above-described methylene includes terminal methyl.

In addition, the acrylate monomer represented by the formula (a') includes a nitrogen- and/or oxygen-containing alcyclic hydrocarbon compounds containing an amino group, an imino group, and/or a carbonyl group, which can have a plurality of acrylate in the molecule (preferably a nitrogen-containing aliphatic hydrocarbon ring containing an imino group and/or a carbonyl group, more preferably a 5- or 6-membered ring containing nitrogen as a member, and most preferably a piperidine derivative, a pyrrolidine derivative or an isocyanurate derivative).

Examples of the acrylate monomer represented by the formula (a') include methoxypolyethylene glycol acrylate, methoxypolyethylene glycol methacrylate, phenoxypolyethylene glycol acrylate, isostearyl acrylate, polyethylene glycol diacrylate, propoxylated bisphenol A diacrylate, tricyclodecane dimethanol diacrylate, 1,6-hexanediol diacrylate, dipropylene glycol diacrylate, ethoxylated isocyanuric acid triacrylate, ethoxylated glycerin triacrylate, trimethylolpropane triacrylate, ditrimethylolpropane tetraacrylate, ethoxylated pentaerythritol tetraacrylate, dipentaerythritol hexaacrylate, and the like, preferably methoxypolyethylene glycol acrylate, tricyclodecane dimethanol diacrylate, and ethoxylated isocyanuric acid triacrylate.

In addition, in the radical polymerization reaction, the molecular weight can be controlled appropriately using a known chain transfer agent, polymerization inhibitor, molecular weight modifier and the like. Further, the polymerization reaction can be performed in one stage, or can be performed in two or more stages. The temperature of the polymerization reaction is not particularly limited, but is typically in the range of 50 to 200° C., preferably 80 to 150° C.

Since the polysiloxane acrylic-polymerized in the process (2) has a complicated three-dimensional structure due to acrylic polymerization, it is considered to contribute to the improvement in heat resistance and adhesion to a substrate.

When a low-concentration developer is used, it is preferable to use the polysiloxane acrylic-polymerized in the process (2).

When a thick film is formed, it is preferable that an acryloyl group remains in the polysiloxane containing any one of (Ia) and (Ia').

In the polysiloxane (Ia) acrylic-polymerized in the process (2), all acryloyl groups do not react in a normal reaction and acryloyl groups that did not undergo a polymerization reaction remain.

The mass average molecular weight of the acrylic-polymerized polysiloxane obtained in the process (2) is preferably 1.4 to 5 times, more preferably 1.4 to 3 times the mass average molecular weight of the acryloyl group-containing polysiloxane obtained in the process (1).

(Acrylic Resin)

The acrylic resin (hereinafter sometimes referred to as acrylic polymer) used in the present invention can be selected from generally used acrylic resin, for example, polyacrylic acid, polymethacrylic acid, polyalkyl acrylate, polyalkyl methacrylate, and the like. The acrylic resin used in the present invention preferably comprises a repeating unit containing an acryloyl group, and also preferably further comprises a repeating unit containing a carboxyl group and/or a repeating unit containing an alkoxysilyl group.

Although the repeating unit containing a carboxyl group is not particularly limited as long as it is a repeating unit containing a carboxyl group at its side chain, a repeating unit derived from an unsaturated carboxylic acid, an unsaturated carboxylic anhydride or a mixture thereof is preferable.

Although the repeating unit containing an alkoxysilyl group can be a repeating unit containing an alkoxysilyl group at its side chain, it is preferably a repeating unit derived from a monomer represented by the following formula (B):

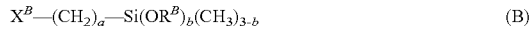

wherein,
$X^B$ is a vinyl group, a styryl group or a (meth)acryloyloxy group, $R^B$ is a methyl group or an ethyl group, a is an integer of 0 to 3, and b is an integer of 1 to 3.

Further, it is preferable that the above-described polymer contains a repeating unit containing a hydroxyl group, which is derived from a hydroxyl group-containing unsaturated monomer.

The mass average molecular weight of the alkali-soluble resin according to the present invention is not particularly limited, and is preferably 1,000 to 40,000, more preferably 2,000 to 30,000. Here, the mass average molecular weight is a mass average molecular weight in terms of polystyrene according to gel permeation chromatography. In addition, as far as the number of acid groups is concerned, the solid content acid value is usually 40 to 190 mgKOH/g, more preferably 60 to 150 mgKOH/g, from the viewpoint of enabling development with a low-concentration alkaline developer and achieving both reactivity and storage stability.

Since a thick film can be formed if the polysiloxane containing an acryloyl group is used alone, it is preferable to use polysiloxane containing (Ia') and/or (Ia) as the alkali-soluble resin.

When polysiloxane containing neither (Ia') nor (Ia) is used, a mixture of the polysiloxane and acrylic resin can be used as the alkali-soluble resin. In this case, the mixing ratio of the acrylic resin and the polysiloxane is not particularly limited, but when the coating film is made to be a thick film, it is preferable that the mixing ratio of the acrylic resin is large. On the other hand, when applied to a high temperature process and from the viewpoint of the transparency and the chemical resistance after curing, it is preferable that the mixing ratio of the polysiloxane is large. For these reasons, the mixing ratio of the polysiloxane and the acrylic resin is preferably 90:10 to 10:90, and more preferably 85:15 to 25:75.

Further, a cured film is formed through application of the composition according to the present invention onto a substrate, imagewise exposure, and development. At this time, it is necessary that a difference in solubility occurs between the exposed area and the unexposed area, and the coating film in the unexposed area should have a certain or more solubility in a developer. For example, it is considered that a pattern can be formed by exposure and development if dissolution rate of the coating film after pre-baked, in a 2.38% tetramethylammonium hydroxide (hereinafter sometimes referred to as TMAH) aqueous solution (hereinafter sometimes referred to as alkali dissolution rate or ADR, which is described later in detail) is 50 Å/sec or more. However, since the required solubility varies depending on the film thickness of the cured film to be formed and the development conditions, the alkali-soluble resin should be appropriately selected according to the development conditions. Although it varies depending on the type and addition amount of the photosensitizer or the silanol catalyst contained in the composition, for example, if the film thickness is 0.1 to 100 μm (1,000 to 1,000,000 Å), the dissolution rate in a 2.38% TMAH aqueous solution is preferably 50 to 20,000 Å/sec, and more preferably 100 to 10,000 Å/sec.

[Measurement of Alkaline Dissolution Rate (ADR) and Calculation Method Thereof]

Using a TMAH aqueous solution as an alkaline solution, the alkali dissolution rate of the alkali-soluble resin is measured and calculated as described below.

The alkali-soluble resin is diluted with propylene glycol monomethyl ether acetate (hereinafter referred to as PGMEA) so as to be 35 mass % and dissolved while stirring at room temperature with a stirrer for 1 hour. In a clean room under an atmosphere of temperature of 23.0±0.5° C. and humidity of 50±5.0%, using a pipette, 1 cc of the prepared alkali-soluble resin solution is dropped on the center area of a 4-inch silicon wafer having a thickness of 525 μm and spin-coated to make a film having a thickness of 2±0.1 μm, and then the film is heated on a hot plate at 100° C. for 90 seconds to remove the solvent. The film thickness of the coating film is measured with a spectroscopic ellipsometer (manufactured by J. A. Woollam).

Next, the silicon wafer having this film is gently immersed in a glass petri dish having a diameter of 6 inches, into which 100 ml of a TMAH aqueous solution adjusted to 23.0±0.1° C. and having a predetermined concentration was put, then allowed to stand, and the time until the coating film disappears is measured. The dissolution rate is determined by dividing by the time until the film in the area of 10 mm inside from the wafer edge disappears. In the case that the dissolution rate is remarkably slow, the wafer is immersed in a TMAH aqueous solution for a certain period and then heated for 5 minutes on a hot plate at 200° C. to remove moisture taken in the film during the dissolution rate measurement. Thereafter, film thickness is measured, and the dissolution rate is calculated by dividing the amount of change in film thickness before and after the immersion, by the immersion time. The above measurement method is performed 5 times, and the average of the obtained values is taken as the dissolution rate of the alkali-soluble resin.

(II) Black Colorant

The composition according to the present invention comprises a black colorant. In the present invention, the black colorant has characteristic light absorption characteristics. Specifically, when the transmittance of the black pigment at the wavelength of 365 nm is $I_{365}$ and the transmittance at the wavelength of 500 nm is $I_{500}$, the transmittance ratio $R_{365/500}$ represented by $I_{365}/I_{500}$ is 1.2 or more, preferably 2.0 or more. Black colorants such as carbon black generally absorb not only visible light but also ultraviolet light. In this case, when a composition containing a black colorant is applied onto a substrate to form a coating film, it sometimes happen that the black colorant absorbs the exposed ultraviolet light and no light reaches the bottom of the coating film and as a result, no pattern is formed. However, the black colorant according to the present invention, which satisfies the specific absorbance, has low absorption of ultraviolet light and high absorption of visible light. Therefore, a pattern can be formed even when a thick film is formed. Then, since the cured film has high absorption of visible light, the formed cured film has a high light shielding property and can function as a bank structure forming material of a display device.

Here, the transmittance is obtained by applying a composition in which 10 mass % of a black colorant is dispersed based on the total mass of the resin, forming a film having a film thickness of 10 μm, and curing at 230° C. Thereafter, the obtained film is measured using UV-vis-NIR (Hitachi High-Technologies Corporation).

As the black colorant used in the present invention, either an inorganic pigment or an organic pigment, or a combination of two or more pigments can be used as long as it satisfies the above absorbance.

As the inorganic pigment, for example, zirconium nitride is preferable. Specifically, "NITBLACK UB-1" by Mitsubishi Materials Corporation can be included.

When the black colorant used in the present invention is an organic pigment, it is preferable to combine two or more pigments. By mixing respective colors of red, green, blue and the like, a black color material can be obtained. The organic pigment is selected from those having a structure of, for example, an azo type, a phthalocyanine type, a quinacridone type, a benzimidazolone type, an isoindolinone type, a dioxazine type, an indanthrene type, a perylene type, and the like. Preferred combinations of pigments include, for example, a combination of one selected from the group consisting of C. I. Pigment Orange 43, C. I. Pigment Orange 64 and C. I. Pigment Orange 72, with C. I. Pigment Blue 60. Other organic pigments can be combined with this combination.

The content of the black colorant used in the present invention is preferably 3 to 80 mass %, more preferably 5 to 50 mass %, based on the total mass of the composition.

In addition, the content of the black colorant is based on the mass of the pigment itself. Thais means that, in some cases, the black colorant is obtained in a dispersed state using a dispersant, and in this case, the mass of the black colorant does not include anything other than the pigment.

The black colorant used in the present invention can be used in combination with a dispersant. As the dispersant, an organic compound-based dispersant such as a polymer dispersant described, for example, in JP-A 2004-292672 can be used.

(II) Polymerization Initiator

The composition according to the present invention comprises a polymerization initiator. The polymerization initiator includes a polymerization initiator that generates an acid, a base or a radical by radiation, and a polymerization initiator that generates an acid, a base or a radical by heat. In the present invention, the former is preferable and the photo radical generator is more preferable, in terms of process shortening and cost since the reaction is initiated immediately after the radiation irradiation and the reheating process performed after the radiation irradiation and before the developing process can be omitted.

The photo radical generator can improve the resolution by strengthening the pattern shape or increasing the contrast of development. The photo radical generator used in the present invention is a photo radical generator that emits a radical when irradiated with radiation. Here, examples of the radiation include visible light, ultraviolet light, infrared light, X-ray, electron beam, α-ray, and γ-ray.

The addition amount of the photo radical generator is preferably 0.001 to 50 mass %, more preferably 0.01 to 30 mass %, based on the total mass of the alkali-soluble resin, though the optimal amount thereof depends on the type and amount of active substance generated by decomposition of the photo radical generator, the required photosensitivity, and the required dissolution contrast between the exposed area and unexposed area. If the addition amount is less than 0.001 mass %, the dissolution contrast between the exposed area and unexposed portion is too low, and the addition effect is not sometimes exhibited. On the other hand, when the addition amount of the photo radical generator is more than 50 mass %, colorless transparency of the coated film sometimes decreases, because it sometimes occurs that cracks are generated in the coated film to be formed and coloring due to decomposition of the photo radical generator becomes remarkable. Further, when the addition amount becomes large, thermal decomposition of the photo radical generator causes deterioration of the electrical insulation of the cured product and release of gas, which sometimes become a problem in subsequent processes. Further, the resistance of the coated film to a photoresist stripper containing monoethanolamine or the like as a main component sometimes deteriorates.

Examples of the photo radical generator include azo-based, peroxide-based, acylphosphine oxide-based, alkylphenone-based, oxime ester-based, and titanocene-based initiators. Among them, alkylphenone-based, acylphosphine oxide-based and oxime ester-based initiators are preferred, and 2,2-dimethoxy-1,2-diphenylethan-1-one, 1-hydroxy-cyclohexylphenyl ketone, 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl)-benzyl]phenyl}-2-methylpropan-1-one, 2-methyl-1-(4-methylthiophenyl)-2-morpholinopropan-1-one, 2-benzyl-2-dimethylamino-1-(4-morpholinophenyl)-1-butanone, 2-(dimethylamino)-2-[(4-methylphenyl)methyl]-1-[4-(4-morpholinyl)-phenyl]-1-butanone, 2,4,6-trimethylbenzoyldiphenyl phosphine oxide, bis (2,4,6-trimethylbenzoyl)-phenyl-phosphine oxide, 1,2-octanedione, 1-[4-(phenylthio)-2-(O-benzoyloxime)], ethanone, 1-[9-ethyl-6-(2-methylbenzoyl)-9H-carbazol-3-yl]-1-(O-acetyloxime), and the like are included.

(IV) Solvent

The composition according to the present invention comprises a solvent. This solvent is not particularly limited as long as it can uniformly dissolve or disperse the above-described alkali-soluble resin, the black colorant, the polymerization initiator, and the additives that are optionally added. Examples of the solvent that can be used in the present invention include ethylene glycol monoalkyl ethers, such as ethylene glycol monomethyl ether, ethylene glycol monoethyl ether, ethylene glycol monopropyl ether and ethylene glycol monobutyl ether; diethylene glycol dialkyl ethers, such as diethylene glycol dimethyl ether, diethylene glycol diethyl ether, diethylene glycol dipropyl ether and diethylene glycol dibutyl ether; ethylene glycol alkyl ether acetates, such as methyl cellosolve acetate and ethyl cellosolve acetate; propylene glycol monoalkyl ethers, such as propylene glycol monomethyl ether and propylene glycol monoethyl ether; propylene glycol alkyl ether acetates such as PGMEA, propylene glycol monoethyl ether acetate and propylene glycol monopropyl ether acetate; aromatic hydrocarbons, such as benzene, toluene and xylene; ketones, such as methyl ethyl ketone, acetone, methyl amyl ketone, methyl isobutyl ketone and cyclohexanone; alcohols, such as ethanol, propanol, butanol, hexanol, cyclohexanol, ethylene glycol and glycerin; esters, such as ethyl lactate, ethyl 3-ethoxypropionate, methyl 3-methoxypropionate; and cyclic esters, such as γ-butyrolactone, and the like. Among them, it is preferable to use propylene glycol alkyl ether acetates or esters together with alcohols having a linear or branched alkyl group having 4 or 5 carbon atoms from the viewpoints of easy availability, easy handling and solubility of the polymer. From the viewpoint of coating properties and storage stability, the solvent ratio of the alcohol is preferably 5 to 80%.

The solvent content of the composition according to the present invention can be freely adjusted according to the method for applying the composition, and the like. For example, when the composition is applied by spray coating, it is also possible to make the proportion of the solvent in the composition to be 90 mass % or more. In the case of slit coating, which is used for coating a large substrate, the solvent content is usually 60 mass % or more, and preferably 70 mass % or more. The properties of the composition of the present invention does not vary largely with the amount of solvent.

Although the composition according to the present invention essentially includes the above-described (I) to (IV), further compounds can be optionally combined. The materials that can be combined are as described below.

(V) Compound Containing Two or More (Meth)Acryloyloxy Groups

The composition according to the present invention can further comprise a compound containing two or more (meth)acryloyloxy groups (hereinafter sometimes referred to as the (meth)acryloyloxy group-containing compound for simplicity). Here, the (meth)acryloyloxy group is a general term for the acryloyloxy group and the methacryloyloxy group. This compound is a compound that can form a crosslinked structure by reacting with the above-described (meth)acryloyloxy group-containing polysiloxane and the above-described alkali-soluble resin or the like. Here, in order to form a crosslinked structure, a compound containing two or more acryloyloxy groups or methacryloyloxy groups, which are reactive groups, is needed, and in order to form a higher-order crosslinked structure, it preferably contains three or more acryloyloxy groups or methacryloyloxy groups.

As such a compound containing two or more (meth)acryloyloxy groups, esters obtained by reacting (α) a polyol compound having two or more hydroxyl groups with (β) two or more (meth)acrylic acids are preferably used. As the polyol compound (α), compounds having, as a basic skeleton, a saturated or unsaturated aliphatic hydrocarbon, aromatic hydrocarbon, heterocyclic hydrocarbon, primary, secondary or tertiary amine, ether or the like, and having, as substituents, two or more hydroxyl groups are included. The polyol compound can contain other substituent, for example, a carboxyl group, a carbonyl group, an amino group, an ether bond, a thiol group, a thioether bond, and the like, as long as the effects of the present invention are not impaired.

Preferred polyol compounds include alkyl polyols, aryl polyols, polyalkanolamines, cyanuric acid, and dipentaerythritol. Here, when the polyol compound (α) has three or more hydroxyl groups, it is not necessary that all the hydroxyl groups have reacted with (meth)acrylic acid, and they can be partially esterified. This means that the esters can have unreacted hydroxyl group(s). As such esters, tris(2-acryloxyethyl) isocyanurate, dipentaerythritol hexa(meth)acrylate, tripentaerythritol octa(meth)acrylate, pentaerythritol tetra(meth)acrylate, dipropylene glycol diacrylate, tripropylene glycol diacrylate, trimethylolpropane triacrylate, polytetramethylene glycol dimethacrylate, trimethylolpropane trimethacrylate, ditrimethylolpropane tetraacrylate, tricyclodecane dimethanol diacrylate, 1,9-nonanediol diacrylate, 1,6-hexanediol diacrylate, 1,10-decanediol diacrylate, and the like are included. Among them, tris(2-acryloxyethyl) isocyanurate and dipentaerythritol hexaacrylate are preferred from the viewpoint of reactivity and the number of crosslinkable groups. Further, in order to adjust the shape of the formed pattern, two or more of these compounds can be combined. Specifically, a compound containing three (meth)acryloyloxy groups and a compound containing two (meth)acryloyloxy groups can be combined.

Such a compound is preferably a molecule that is relatively smaller than the alkali-soluble resin from the viewpoint of reactivity. For this reason, the molecular weight thereof is preferably 2,000 or less, and more preferably 1,500 or less.

Although the content of the (meth)acryloyloxy group-containing compound is adjusted according to the type of the polymer or the (meth)acryloyloxy group-containing compound to be used, it is preferably 5 to 1,000 mass %, more preferably 10 to 800 mass %, based on the total mass of the alkali-soluble resin from the viewpoint of compatibility with resin. When a low-concentration developer is used, the content is preferably 30 to 800 mass %. Further, the (meth)acryloyloxy group-containing compounds can be used alone or in combination of two or more.

(VI) Saccharide

The composition according to the present invention can further comprise a saccharide. The saccharide can be any of a monosaccharide, an oligosaccharide and a polysaccharide, but is preferably an oligosaccharide. Here, in the present specification, the oligosaccharide refers to a saccharide formed by dehydrating and condensing 2 to 10 molecules of a monosaccharide, and also includes a cyclic oligosaccharide (for example, cyclodextrin). Among these saccharides, cyclodextrin or disaccharide obtained by condensing two molecules of monosaccharide is preferable, and disaccharide obtained by condensing two molecules of monosaccharide is more preferable. Further, the saccharide is preferably added with an alkylene oxide having 1 to 6 carbon atoms, more preferably an alkylene oxide having 2 to 5 carbon atoms, and further preferably ethylene oxide or propylene oxide. That is, it is preferable that the hydroxy group (—OH) contained in the saccharide is replaced with —($C_xH_{2x}$—O—$)_y$—H. Here, x is an integer of 2 to 6, preferably an integer of 2 to 5, more preferably 2 or 3, and y is an integer of 1 to 8, more preferably an integer of 2 to 5.

According to the study of the present inventors, it has been found that such a saccharide has a dissolution promoting effect in a developer. It is considered that saccharide is dissolved in the solvent in the composition and dissolved also in the developer, thus having a dissolution promoting effect, because it has hydrophilicity and hydrophobicity. Such an effect is particularly beneficial when the development of the composition according to the present invention is carried out with a low-concentration developer.

The content of the saccharide used in the present invention is preferably 1 to 80 mass %, more preferably 5 to 50 mass %, based on the total mass of the alkali-soluble resin.

The content of the components other than (I) to (VI) in the entire composition is preferably 30% or less, more preferably 20% or less, and further preferably 10% or less, based on the total mass of the composition.

(VII) Other Additives

The composition according to the present invention can optionally comprise other additives. As such additives, a developer dissolution accelerator, a scum remover, an adhesion enhancer, a polymerization inhibitor, an antifoaming agent, a surfactant, a photosensitizing enhancing agent, a crosslinking agent, a curing agent, and the like are included.

The developer dissolution accelerator or scum remover has a function of adjusting the solubility of the formed coated film in the developer and preventing scum from remaining on the substrate after development. As such an additive, crown ether can be used. The crown ether having the simplest structure is represented by the general formula (—$CH_2$—$CH_2$—O—$)_n$. Preferred in the present invention are those in which n is 4 to 7. When x is set to be the total number of atoms constituting the ring and y is set to be the number of oxygen atoms contained therein, the crown ether is sometimes called x-crown-y-ethers. In the present invention, preferred is selected from the group consisting of crown ethers, wherein x=12, 15, 18 or 21, and y=x/3, and their benzo condensates and cyclohexyl condensates. Specific examples of more preferred crown ethers include 21-crown-7-ether, 18-crown-6-ether, 15-crown-5-ether, 12-crown-4-ether, dibenzo-21-crown-7-ether, dibenzo-18-crown-6-ether, dibenzo-15-crown-5-ether, dibenzo-12-crown-4-ether, dicyclohexyl-21-crown-7-ether, dicyclohexyl-18-crown-6-ether, icyclo-hexyl-15-crown-5-ether, and dicyclohexyl-12-crown-4-ether. In the present invention, among them, most preferred is selected from 18-crown-6-ether and 15-crown-5-ether. The content thereof is preferably 0.05 to 15 mass %, more preferably 0.1 to 10 mass %, based on the total mass of the alkali-soluble resin.

The adhesion enhancer has an effect of preventing a pattern from peeling off due to stress applied after baking when a cured film is formed using the composition according to the present invention. As the adhesion enhancer, imidazoles, silane coupling agents, and the like are preferred. Among imidazoles, 2-hydroxybenzimidazole, 2-hydroxyethylbenzimidazole, benzimidazole, 2-hydroxyimidazole, imidazole, 2-mercaptoimidazole and 2-aminoimidazole are preferable, and 2-hydroxybenzimidazole, benzimidazole, 2-hydroxyimidazole and imidazole are particularly preferably used.

As the silane coupling agent, known ones are suitably used, and examples thereof include epoxy silane coupling agents, amino silane coupling agents, mercapto silane coupling agents, and the like. Specifically, 3-glycidoxypropyltrimethoxysilane, 3-glycidoxypropyl-triethoxysilane, N-2-(aminoethyl)-3-aminopropyltri-methoxysilane, N-2-(aminoethyl)-3-aminopropyltri-ethoxysilane, 3-aminopropyltrimethoxysilane, 3-amino-propyltriethoxysilane, 3-ureidopropyltriethoxysilane, 3-chloropropyltriethoxysilane, 3-mercaptopropyltri-methoxysilane, 3-isocyanatopropyltriethoxysilane, and the like are preferred. These can be used alone or in combination of two or more, and the addition amount thereof is preferably 0.05 to 15 mass % based on the total mass of the alkali-soluble resin.

Further, as the silane coupling agent, a silane compound and siloxane compound having an acid group, or the like can be used. Examples of the acid group include a carboxyl group, an acid anhydride group, a phenolic hydroxyl group, and the like. When it contains a monobasic acid group such as a carboxyl group or a phenolic hydroxyl group, it is preferred that a single silicon-containing compound has a plurality of acid groups.

Exemplified embodiments of such a silane coupling agent include a compound represented by the formula (C):

$$X_nSi(OR^3)_{4-n} \quad (C)$$

or polymer obtained using it as a repeating unit. At this time, a plurality of repeating units having different X or $R^3$ can be used in combination.

In the formula, $R^3$ includes a hydrocarbon group, for example, an alkyl group such as a methyl group, an ethyl group, an n-propyl group, an isopropyl group, and an n-butyl group. In the general formula (C), a plurality of $R^3$ are included, and each $R^3$ can be identical or different.

As X, those having an acid group such as phosphonium, borate, carboxyl, phenol, peroxide, nitro, cyano, sulfo, and alcohol group are included, and those in which these acid groups are protected by acetyl, aryl, amyl, benzyl, methoxymethyl, mesyl, tolyl, trimethoxysilyl, triethoxysilyl, triisopropylsilyl or trityl group, and an acid anhydride group are included.

Among them, a compound having a methyl group as $R^3$ and a carboxylic acid anhydride group as X, such as an acid anhydride group-containing silicone, is preferable. More specifically, a compound represented by the following formula (X-12-967C (trade name, Shin-Etsu Chemical Co., Ltd.)) or polymer containing a structure corresponding thereto in its terminal or side chain of a silicon-containing polymer such as silicone is preferred.

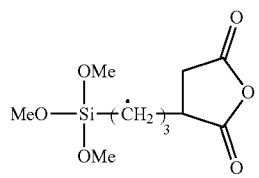

Further, a compound in which thiol, phosphonium, borate, carboxyl, phenol, peroxide, nitro, cyano, and an acid group such as sulfo group is provided at the terminal of dimethyl silicone is also preferable. As such a compound, compounds represented by the following formulae (X-22-2290AS and X-22-1821 (trade name in every case, Shin-Etsu Chemical Co., Ltd.)) are included.

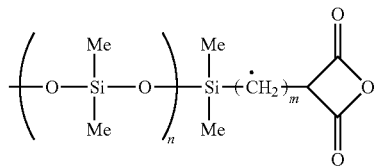

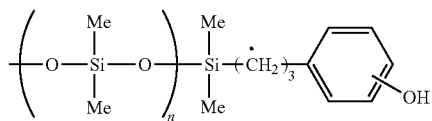

When the silane coupling agent has a silicone structure, if the molecular weight is too large, the compatibility with polysiloxane contained in the composition becomes poor, so that there is a possibility that there is an adverse effect such that the solubility in the developer does not improve, the reactive group remains in the film, and the chemical resistance that can withstand the subsequent process cannot be maintained. For this reason, the mass average molecular weight of the silane coupling agent is preferably 5,000 or less, and more preferably 4,000 or less. The content of the silane coupling agent is preferably 0.01 to 15 mass % based on the total mass of the alkali-soluble resin.

As the polymerization inhibitor, an ultraviolet absorber as well as nitrone, nitroxide radical, hydroquinone, catechol, phenothiazine, phenoxazine, hindered amine and derivatives thereof can be added. Among them, methylhydroquinone, catechol, 4-t-butylcatechol, 3-methoxycatechol, phenothiazine, chlorpromazine, phenoxazine, TINUVIN 144, 292 and 5100 (BASF) as the hindered amine, and TINUVIN 326, 328, 384-2, 400 and 477 (BASF) as the ultraviolet absorber are preferred. These can be used alone or in combination of two or more, and the content thereof is preferably 0.01 to 20 mass % based on the total mass of the alkali-soluble resin.

As the antifoaming agent, alcohols ($C_{1-18}$), higher fatty acids such as oleic acid and stearic acid, higher fatty acid esters such as glycerin monolaurate, polyethers such as polyethylene glycols (PEG) (Mn: 200 to 10,000) and polypropylene glycols (PPG) (Mn: 200 to 10,000), silicone compounds such as dimethyl silicone oil, alkyl-modified silicone oil and fluorosilicone oil, and organosiloxane-based surfactants described in detail below are included. These can be used alone or in combination of a plurality of these, and the content thereof is preferably 0.1 to 3 mass % based on the total mass of the alkali-soluble resin.

Further, the composition according to the present invention can optionally comprise a surfactant. The surfactant is added for the purpose of improving coating properties, developability, and the like. Examples of the surfactant that can be used in the present invention include nonionic surfactants, anionic surfactants, and amphoteric surfactants.

Examples of the nonionic surfactant include, polyoxyethylene alkyl ethers, such as polyoxyethylene lauryl ether, polyoxyethylene oleyl ether and polyoxyethylene cetyl ether; polyoxyethylene fatty acid diester; polyoxyethylene fatty acid monoester; polyoxyethylene polyoxypropylene block polymer; acetylene alcohol; acetylene glycol; polyethoxylate of acetylene alcohol; acetylene glycol derivatives, such as polyethoxylate of acetylene glycol; fluorine-containing surfactants, such as Fluorad (trade name, 3M Japan Limited), Megafac (trade name, DIC Corporation), Surflon (trade name, AGC Inc.); or organosiloxane surfactants, such as KP341 (trade name, Shin-Etsu Chemical Co., Ltd.). Examples of the above-described acetylene glycol include 3-methyl-1-butyne-3-ol, 3-methyl-1-pentyn-3-ol, 3,6-dimethyl-4-octyne-3,6-diol, 2,4,7,9-tetramethyl-5-decyne-4,7-diol, 3,5-dimethyl-1-hexyne-3-ol, 2,5-di-methyl-3-hexyne-2,5-diol, 2,5-di-methyl-2,5-hexanediol, and the like.

Further, examples of the anionic surfactant include ammonium salt or organic amine salt of alkyl diphenyl ether disulfonic acid, ammonium salt or organic amine salt of alkyl diphenyl ether sulfonic acid, ammonium salt or organic amine salt of alkyl benzene sulfonic acid, ammonium salt or organic amine salt of polyoxyethylene alkyl ether sulfuric acid, ammonium salt or organic amine salt of alkyl sulfuric acid, and the like.

Further, examples of the amphoteric surfactant include 2-alkyl-N-carboxymethyl-N-hydroxyethyl imidazolium betaine, lauric acid amide propyl hydroxysulfone betaine, and the like.

These surfactants can be used alone or as a mixture of two or more types, and the content thereof is preferably 0.005 to 1 mass %, more preferably 0.01 to 0.5 mass %, based on the total mass of the composition.

A photosensitizing enhancing agent can be optionally added to the composition according to the present invention. The photosensitizing enhancing agent preferably used in the composition according to the present invention includes coumarin, ketocoumarin and their derivatives, thiopyrylium salts, acetophenones, and the like, and specifically, p-bis(o-methylstyryl) benzene, 7-dimethylamino-4-methylquinolone-2,7-amino-4-methylcounnarin, 4,6-di-methyl-7-ethylaminocoumarin, 2-(p-dimethylamino-styryl)-pyridylmethyl-iodide, 7-diethylannninocounnarin, 7-diethylamino-4-methyl-coumarin, 2,3,5,6-1H,4H-tetra-hydro-8-methyl-quinolizino-<9,9a,1-gh>coumarin, 7-diethylamino-4-trifluoromethylcoumarin, 7-dimethyl-amino-4-trifluoro-methylcoumarin, 7-amino-4-trifluoro-methylcoumarin, 2,3,5,6-1H,4H-tetrahydroquinolizino-<9,9a,1-gh>coumarin, 7-ethylamino-6-methyl-4-trifluoromethylcoumarin, 7-ethylamino-4-trifluoro-methylcoumarin, 2,3,5,6-1H,4H-tetrahydro-9-carbo-ethoxyquinolizino-<9,9a,1-gh>coumarin, 3-(2'-N-methylbenzimidazolyl)-7-N,N-diethylaminocoumarin, N-methyl-4-trifluoro-methylpiperidino-<3,2-g>coumarin, 2-(p-dimethylaminostyryl)-benzothiazolylethyl iodide, 3-(2'-benzimidazolyl)-7-N,N-diethylaminocoumarin, 3-(2'-benzothiazolyl)-7-N,N-diethylaminocoumarin, and sensitizing dyes such as pyrylium salts and thiopyrylium salts represented by the following chemical formula. By the addition of the sensitizing dye, patterning using an inexpensive light source such as a high-pressure mercury lamp (360 to 430 nm) becomes possible. The content thereof is preferably 0.05 to 15 mass %, more preferably 0.1 to 10 mass %, based on the total mass of the alkali-soluble resin.

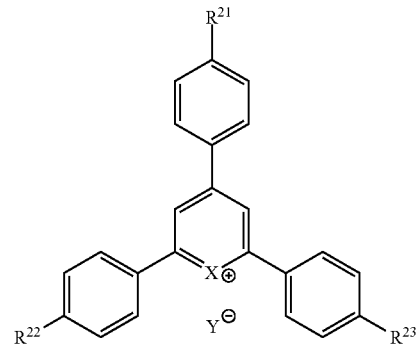

| X | $R^{21}$ | $R^{22}$ | $R^{23}$ | Y |
|---|---|---|---|---|
| S | $OC_4H_9$ | H | H | $BF_4$ |
| S | $OC_4H_9$ | $OCH_3$ | $OCH_3$ | $BF_4$ |
| S | H | $OCH_3$ | $OCH_3$ | $BF_4$ |
| S | $N(CH_3)_2$ | H | H | $ClO_2$ |
| O | $OC_4H_9$ | H | H | $SbF_6$ |

Further, as the photosensitizing enhancing agent, an anthracene skeleton-containing compound can be also used. Specifically, a compound represented by the following formula is included.

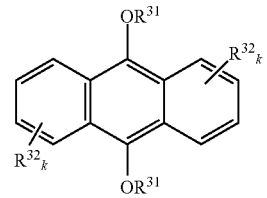

wherein, $R^{31}$ each independently represents a substituent selected from the group consisting of an alkyl group, an aralkyl group, an allyl group, a hydroxyalkyl group, an alkoxyalkyl group, a glycidyl group, and a halogenated alkyl group, $R^{32}$ each independently represents a substituent selected from the group consisting of a hydrogen atom, an alkyl group, an alkoxy group, a halogen atom, a nitro group, a sulfonic acid group, a hydroxyl group, an amino group, and a carboalkoxy group, and k is each independently selected from 0 and an integer of 1 to 4.

When such a photosensitizing enhancing agent having an anthracene skeleton is used, its content is preferably 0.01 to 5 mass % based on the total mass of the alkali-soluble resin.

Method for Forming Cured Film

The method for forming a cured film according to the present invention comprises applying the above-described composition onto a substrate to form a coating film, exposing the coating film, and developing the coating film. The method for forming a cured film is described in process order as follows.

(1) Application Process

First, the above-described composition is applied onto a substrate. Formation of the coating film of the composition in the present invention can be carried out by any method conventionally known as a method for applying a photosensitive composition. Specifically, it can be freely selected from dip coating, roll coating, bar coating, brush coating, spray coating, doctor coating, flow coating, spin coating, slit coating, and the like. Further, as the substrate on which the composition is applied, a suitable substrate such as a silicon substrate, a glass substrate, a resin film, and the like can be used. Various semiconductor devices and the like can be formed on these substrates as needed. When the substrate is a film, gravure coating can also be utilized. If desired, a drying process can be additionally provided after applying the film. Further, if necessary, the applying process can be repeated once or twice or more to make the film thickness of the coating film to be formed as desired (2) Pre-Baking Process After forming the coating film of the composition by applying the composition, it is preferable to carry out pre-baking (heat treatment) of the coating film in order to dry the coating film and reduce the residual amount of the solvent in the coating film. The pre-baking process can be carried out at a temperature of generally 50 to 150° C., preferably 90 to 120° C., in the case of a hot plate, for 10 to 300 seconds, preferably 30 to 120 seconds and in the case of a clean oven, for 1 to 30 minutes.

(3) Exposure Process

After forming a coating film, the coating film surface is then irradiated with light. As the light source to be used for the light irradiation, any one conventionally used for a pattern forming method can be used. As such a light source, a high-pressure mercury lamp, a low-pressure mercury lamp, a lamp such as metal halide and xenon, a laser diode, an LED and the like can be included. As the irradiation light, ultraviolet ray such as g-line, h-line and i-line is usually used. Except ultrafine processing for semiconductors or the like, it is general to use light of 360 to 430 nm (high-pressure mercury lamp) for patterning of several μm to several dozens of μm. The energy of the irradiation light is generally 5 to 2,000 mJ/cm$^2$, preferably 10 to 1,000 mJ/cm$^2$, although it depends on the light source and the film thickness of the coating film. If the irradiation light energy is lower than 5 mJ/cm$^2$, sufficient resolution cannot be obtained in some cases. On the other hand, when the irradiation light energy is higher than 2,000 mJ/cm$^2$, the exposure becomes excess and occurrence of halation is sometimes brought.

In order to irradiate light in a pattern shape, a general photomask can be used. Such a photomask can be freely selected from well-known ones. The environment at the time of irradiation is not particularly limited and can generally be set as an ambient atmosphere (in the air) or nitrogen atmosphere. Further, in the case of forming a film on the entire surface of the substrate, light irradiation can be performed over the entire surface of the substrate. In the present invention, the pattern film also includes such a case where a film is formed on the entire surface of the substrate.

(4) Post Exposure Baking Process

After the exposure, to promote the reaction between the polymer in the film by the polymerization initiator, post exposure baking can be performed as necessary. Different from the heating process (6) to be described later, this heating treatment is performed not to completely cure the coating film but to leave only a desired pattern on the substrate after development and to make other areas capable of being removed by development. Therefore, it is not essential in the present invention.

When the post exposure baking is performed, a hot plate, an oven, a furnace, and the like can be used. The heating temperature should not be excessively high because it is not desirable for the acid, base or radical in the exposed area, which is generated by light irradiation, to diffuse to the unexposed area. From such a viewpoint, the range of the heating temperature after exposure is preferably 40 to 150° C., and more preferably 60 to 120° C. Stepwise heating can be applied as needed to control the curing rate of the composition. Further, the atmosphere during the heating is not particularly limited and can be selected from in an inert gas such as nitrogen, under a vacuum, under a reduced pressure, in an oxygen gas, and the like, for the purpose of controlling the curing rate of the composition. Further, the heating time is preferably above a certain level in order to maintain higher the uniformity of temperature history in the wafer surface and is preferably not excessively long in order to suppress diffusion of the generated acid, base or radical. From such a viewpoint, the heating time is preferably 20 seconds to 500 seconds, and more preferably 40 seconds to 300 seconds.

(5) Developing Process

After post-exposure heating is optionally performed after exposure, the coating film is developed. As the developer to be used at the time of development, any developer conventionally used for developing a photosensitive composition can be used. Preferable examples of the developer include an alkali developer which is an aqueous solution of an alkaline compound such as tetraalkylammonium hydroxide, choline, alkali metal hydroxide, alkali metal metasilicate (hydrate), alkali metal phosphate (hydrate), a sodium carbonate aqueous solution, ammonia, alkylamine, alkanolamine and heterocyclic amine, and a particularly preferable alkali developer is a tetramethylammonium hydroxide aqueous solution, a potassium hydroxide aqueous solution, a sodium hydroxide aqueous solution, or a sodium carbonate aqueous solution. In this alkali developer, a water-soluble organic solvent such as methanol and ethanol, or a surfactant can be further contained, if necessary. In the present invention, the development can be performed using a developer having a lower concentration than a 2.38 mass % TMAH developer that is usually used as a developer. Examples of such a developer include a 0.05 to 1.5 mass % TMAH aqueous solution, a 0.1 to 2.5 mass % sodium carbonate aqueous solution, and a 0.01 to 1.5 mass % potassium hydroxide aqueous solution. The developing time is usually 10 to 300 seconds, preferably 30 to 180 seconds. The developing method can also be freely selected from conventionally known methods. Specifically, methods such as dipping in a developer (dip), paddle, shower, slit, cap coat, spray, and the like can be included. After the development with a developer, by which a pattern can be obtained, it is preferable that rinsing with water is carried out.

(6) Heating Process

After development, the obtained pattern film is cured by heating. As the heating apparatus used for the heating process, the same one as used for the above-described post-exposure heating can be used. The heating temperature in this heating process is not particularly limited as long as it is a temperature at which curing of the coating film can be performed, and it can be freely determined. However, if the silanol group of polysiloxane remains, the chemical resistance of the cured film sometimes becomes insufficient, or dielectric constant of the cured film sometimes becomes higher. From such viewpoints, a relatively high temperature is generally selected as the heating temperature. However, the composition according to the invention is capable of being cured at relatively low temperature. Specifically, it is preferable to cure by heating at 350° C. or lower, and in order to maintain a high remaining film ratio after curing, the curing temperature is more preferably 300° C. or lower, and particularly preferably 250° C. or lower. On the other hand, in order to accelerate the curing reaction and obtain a sufficiently cured film, the curing temperature is preferably 70° C. or higher, more preferably 100° C. or higher. Further, the heating time is not particularly limited and is generally 10 minutes to 24 hours, and preferably 30 minutes to 3 hours. In addition, this heating time is a time from when the temperature of the pattern film reaches a desired heating temperature. Usually, it takes about several minutes to several hours for the pattern film to reach a desired temperature from the temperature before heating.

The cured film thus formed exhibits the effects of the present invention as long as it has an average film thickness of 100 μm or less, and is preferably a film having that of 5 to 100 μm. It is more preferably 5 to 25 μm, and still more preferably 8 to 20 μm. The average optical density (OD) of the cured film is preferably 2 or more at the wavelength of 400 to 700 nm. Here, the measurement of the optical density is performed using Spectrophotometer CM-5 (Konica Minolta, Inc.). The cured film according to the present invention has an excellent light shielding property and can be used as a bank structure forming material of a display device. Since the cured film according to the present invention can be made thicker, it can be suitably used for quantum dots and organic electroluminescence devices that require a thicker bank structure forming material.

The present invention is described more specifically below with reference to Examples and Comparative Examples, but the present invention is not limited by these Examples and Comparative Examples at all.

Gel permeation chromatography (GPC) was measured using two columns of HLC-8220 GPC type high-speed GPC system (trade name, manufactured by Tosoh Corporation) and Super Multipore HZ-N type GPC column (trade name, manufactured by Tosoh Corporation). The measurement was performed using monodisperse polystyrene as a standard sample and tetrahydrofuran as an eluent, under the analytical conditions of a flow rate of 0.6 ml/min and a column temperature of 40° C.

SYNTHESIS EXAMPLE 1: SYNTHESIS OF POLYSILOXANE A

In a 2 L flask equipped with a stirrer, a thermometer and a condenser, 36.7 g of a 25 mass % TMAH aqueous solution, 600 ml of IPA and 3.0 g of water were charged, and then in a dropping funnel, a mixed solution of 17 g of methyltrimethoxysilane, 29.7 g of phenyltrimethoxysilane, 7.6 g of tetramethoxysilane and 43.4 g of 3-(methacryloyloxy) propyltrimethoxysilane was prepared.

The mixed solution was added dropwise at 40° C., and stirred at the same temperature for 2 hours, and then neutralized by adding a 10% HCl aqueous solution. 400 ml of toluene and 600 ml of water were added to the neutralized solution to separate into two layers, and the aqueous layer was removed. Further, after rinsing three times with 300 ml of water, the obtained organic layer was concentrated under reduced pressure to remove the solvent, and PGMEA was added to the concentrate to adjust the solid content concentration to be 30 mass %, thereby obtaining a polysiloxane solution. Mw of the polysiloxane obtained at this stage was 3,722.

In a 100 mL flask equipped with a stirrer, thermometer and a condenser, 14.7 g of the polysiloxane solution, 0.35 g of methacrylic acid and 0.63 g of azabisisobutyronitrile were charged, and the mixture was stirred at 80° C. for 4 hours, thereby obtaining a polysiloxane A solution. Mw of the obtained polysiloxane A was 5,966.

SYNTHESIS EXAMPLE 2: SYNTHESIS OF POLYSILOXANE A'

In a 2 L flask equipped with a stirrer, a thermometer and a condenser, 125.0 g of a 50% 2-hydroxyethyltrimethylammonium hydroxide aqueous solution and 40 g of 1-methoxy-2-propanol were charged, and then in a dropping funnel, a mixed solution of 108.8 g of methyltrimethoxysilane, 118.8 g of phenyltrimethoxy-silane, 41.6 g of tetramethoxysilane and 99.2 g of 3-(methacryloyloxy) propyltrimethoxysilane was prepared. The mixed solution was added dropwise to a solution cooled to 5° C. with ice, stirred at the same temperature for 2 hours, and then neutralized by adding a 10% HCl aqueous solution. 400 ml of toluene and 600 ml of water were added to the neutralized solution to separate into two layers, and the aqueous layer was removed. Further, after rinsing three times with 300 ml of water, the obtained organic layer was concentrated under reduced pressure to remove the solvent, and PGMEA was added to the concentrate to adjust the solid content concentration to be 30 mass %, thereby obtaining a polysiloxane solution A'. Mw of the polysiloxane A' obtained at this stage was 2,000.

SYNTHESIS EXAMPLE 3: SYNTHESIS OF POLYSILOXANE B

In a 2 L flask equipped with a stirrer, a thermometer and a condenser, 36.7 g of a 25 mass % TMAH aqueous solution, 600 ml of IPA and 3.0 g of water were charged, and then in a dropping funnel, a mixed solution of 17 g of methyltrimethoxysilane, 29.7 g of phenyltrimethoxysilane, 7.6 g of tetramethoxysilane and 43.4 g of 3-(methacryloyloxy) propyltrimethoxysilane was prepared. The mixed solution was added dropwise at 40° C., stirred at the same temperature for 2 hours, and then neutralized by adding a 10% HCl aqueous solution. 400 ml of toluene and 600 ml of water were added to the neutralized solution to separate into two layers, and the aqueous layer was removed. Further, after rinsing three times with 300 ml of water, the obtained organic layer was concentrated under reduced pressure to remove the solvent, and PGMEA was added to the concentrate to adjust the solid content concentration to be 30 mass %, thereby obtaining a polysiloxane solution. Mw of the polysiloxane obtained at this stage was 3,722.

In a 100 mL flask equipped with a stirrer, a thermometer and a condenser, 7.35 g of the polysiloxane solution, 0.85 g of ethoxylated isocyanuric acid triacrylate and 0.63 g of azabisisobutyronitrile were charged, and the mixture was stirred at 80° C. for 4 hours, thereby obtaining a polysiloxane B solution. Mw of the obtained polysiloxane B was 6,100.

SYNTHESIS EXAMPLE 4: SYNTHESIS OF ACRYLIC POLYMER A

In a 2 L separable flask equipped with a stirrer, a thermometer, a reflux condenser, a dropping funnel and a nitrogen introducing pipe, 500 g of PGMEA was added. After raising the temperature to 95° C., 160 g of methacrylic acid, 100 g of methyl methacrylate and 16.6 g of t-butyl peroxy-2-ethylhexanoate (Perbutyl O; NOF Corporation) was added dropwise for 3 hours. After the dropwise addition, the mixture was stirred at room temperature for 4 hours to synthesize a polymer solution. To this polymer solution, 160 g of 3,4-epoxycyclohexylmethyl acrylate, 1.5 g of triphenylphosphine and 1.0 g of methylhydroquinone were added, and the mixture was reacted at 110° C. for 6 hours under a nitrogen atmosphere. After completion of the reaction, the resulting product was diluted with PGMEA so that the solid content became 35 mass %, thereby obtaining an acrylic polymer A having Mw of 11,000.

SYNTHESIS EXAMPLE 5: SYNTHESIS OF ACRYLIC POLYMER B

In a 2 L flask equipped with a stirrer, a thermometer and a condenser, 500 g of bisphenol F type epoxy resin (YDF2001 (trade name), Nippon Steel Chemical & Material Co., Ltd.), 80 g of acrylic acid, 0.5 g of methylhydroquinone, 150 g of carbitol acetate were mixed, and the mixture was heated and stirred at 90° C. Then, after cooling to 60° C., 2 g of trioctylmethylammonium chloride was mixed, and heated to 110° C. to cause a reaction. 230 g of tetrahydrophthalic anhydride and 85 g of carbitol acetate were mixed, heated to 80° C., and stirred for 6 hours to obtain a reaction mixture. Mw of the obtained acrylic polymer B was 12,300.

SYNTHESIS EXAMPLE 6: SYNTHESIS OF ACRYLIC POLYMER C

In a 1 L flask equipped with a stirrer, a thermometer, a condenser and a nitrogen gas introducing pipe, 16.4 g of azobisisobutyronitrile and 120 g of butanol were charged, and under a nitrogen gas atmosphere, the temperature was raised to an appropriate temperature, while referring to the 10-hour half-life temperature of the initiator. Separately from that, a mixture liquid was prepared by mixing 13.0 g of methacrylic acid, 46.5 g of KBM-502, 6.5 g of 2-hydroxyethyl methacrylate and 60.0 g of methyl methacrylate, and the mixed liquid was dropped into the above-described solvent for 4 hours. Thereafter, the resulting product was reacted for 3 hours to obtain an acrylic polymer C having Mw of 7,000.

EXAMPLE 1

In a solution containing 100 parts by mass of the polysiloxane A obtained in Synthesis Example 1, 6.0 parts by mass of "Irgacure OXE-02" from BASF as a polymerization initiator, each 300 parts by mass of dipentaerythritol hexaacrylate ("A-DPH", Shin-Nakamura Chemical Co., Ltd.) and polyethylene glycol #600 diacrylate ("A-600", Shin-Nakamura Chemical Co., Ltd.) as a (meth)acryloyloxy group-containing compound, and 0.01 mass % of "AKS-10" (Shin-Etsu Chemical Co., Ltd.) as a surfactant, based on the total mass of the composition, were added, and further PGMEA was added to prepare a 35% solution. Further, using an organic pigment A (pigment orange and pigment blue) as a black colorant, a dispersant was prepared so as to make a concentration of 20 mass % by combining each 7 mass % (a total of 14 mass %) of pigment orange and pigment blue, based on the total mass of the composition, and a dispersant ("DisperBYK-2000", BYK Chemie), and then the dispersant was added to the solution to obtain a composition of Example 1. In addition, $R_{365/500}$ of this black colorant was 1.3.

EXAMPLES 2 TO 20, COMPARATIVE EXAMPLES 1 TO 3

Compositions for which the formulation of Example 1 was each changed as shown in Tables 1 to 3 were prepared. In the tables, numerical values other than those for the black colorant indicate parts by mass.

TABLE 1

| | | | Example | | | | | | | | | |
|---|---|---|---|---|---|---|---|---|---|---|---|---|
| | | | 1 | 2 | 3 | 4 | 5 | 6 | 7 | 8 | 9 | 10 |
| Composition | Alkali-soluble resin | Polysiloxane A | 100 | 100 | 100 | 100 | 100 | 100 | | | | |
| | | Polysiloxane A' | | | | | | | | | | |
| | | Polysiloxane B | | | | | | | | | | |
| | | Acrylic polymer A | | | | | | | 100 | 100 | 100 | 100 |
| | | Acrylic polymer B | | | | | | | | | | |
| | | Acrylic polymer C | | | | | | | | | | |
| | Black colorant | Organic pigment A | 14 | | 14 | 14 | 14 | | 14 | | | |
| | | Inorganic pigment A | | 12 | | | | 12 | | 12 | 12 | 12 |
| | | MnFe | | | | | | | | | | |
| | | TiN | | | | | | | | | | |
| | | Carbon black | | | | | | | | | | |
| | Polymerization initiator A | | 6 | 6 | 6 | 6 | 6 | 6 | 6 | 6 | 6 | 6 |
| | (meth)acryloyloxy group-containing compound | Compound A | 300 | 300 | 400 | 300 | 200 | 200 | 300 | 300 | 200 | 200 |
| | | Compound B | 300 | 300 | | 150 | | 200 | 300 | 300 | | |
| | | Compound C | | | | | | | | | | |
| | Saccharide A | | | | | | 30 | | | | 30 | 30 |
| | Surfactant A | | 0.01 | 0.01 | 0.01 | 0.01 | 0.01 | 0.01 | 0.01 | 0.01 | 0.01 | 0.01 |
| Evaluation | pattern formation at film thickness of 2 μm | | OK | OK | OK | OK | OK | OK | OK | OK | OK | OK |
| | pattern formation at film thickness of 10 μm | | OK | OK | OK | OK | OK | OK | OK | OK | OK | OK |
| | resolution | | 8 | 10 | 10 | 10 | 10 | 10 | 20 | 20 | 20 | 20 |
| | pattern shape | | A | A | B | B | B | B | A | A | B | B |
| | O D | | 2 | 2 | 2 | 2 | 2 | 2 | 2 | 2 | 2 | 2 |

TABLE 2

| | | | Example | | | | | | | | | |
|---|---|---|---|---|---|---|---|---|---|---|---|---|
| | | | 11 | 12 | 13 | 14 | 15 | 16 | 17 | 18 | 19 | 20 |
| Composition | Alkali-soluble resin | Polysiloxane A | | | | | | | | | | |
| | | Polysiloxane A' | | | | | | | | 100 | | |
| | | Polysiloxane B | | | | | | | | | 100 | |
| | | Acrylic polymer A | 100 | | | | | | | | | |
| | | Acrylic polymer B | | 100 | 100 | 100 | 100 | 100 | 100 | | | |
| | | Acrylic polymer C | | | | | | | | | | 100 |
| | Black colorant | Organic pigment A | | 14 | | | | 10.5 | 19.6 | | | |
| | | Inorganic pigment A | 12 | | 12 | 14.4 | 20 | | | 12 | 12 | 12 |
| | | MnFe | | | | | | | | | | |
| | | TiN | | | | | | | | | | |
| | | Carbon black | | | | | | | | | | |
| | Polymerization initiator A | | 6 | 6 | 6 | 6 | 6 | 6 | 6 | 6 | 6 | 6 |
| | (meth)acryloyloxy group-containing compound | Compound A | 150 | 300 | 300 | 300 | 300 | 300 | 300 | 300 | 300 | 300 |
| | | Compound B | | 300 | | | | | | 300 | 300 | 300 |
| | | Compound C | 50 | | | | | | | | | |
| | Saccharide A | | 30 | | 30 | 30 | 30 | 30 | 30 | 30 | 30 | 30 |
| | Surfactant A | | 0.01 | 0.01 | 0.01 | 0.01 | 0.01 | 0.01 | 0.01 | 0.01 | 0.01 | 0.01 |
| Evaluation | pattern formation at film thickness of 2 μm | | OK | OK | OK | OK | OK | OK | OK | OK | OK | OK |
| | pattern formation at film thickness of 10 μm | | OK | OK | OK | OK | OK | OK | OK | OK | OK | peeling |
| | resolution | | 20 | 8 | 8 | 10 | 10 | 8 | 8 | 30 | 20 | 10 |
| | pattern shape | | B | A | B | B | B | A | B | B | B | B |
| | O D | | 2 | 2 | 2 | 3 | 4 | 1.7 | 2.5 | 2 | 2 | 2 |

TABLE 3

| | | | Comparative Example | | |
|---|---|---|---|---|---|
| | | | 1 | 2 | 3 |
| Composition | Alkali-soluble resin | Polysiloxane A | 100 | 100 | 100 |
| | | Polysiloxane A' | | | |
| | | Polysiloxane B | | | |
| | | Acrylic polymer A | | | |
| | | Acrylic polymer B | | | |
| | | Acrylic polymer C | | | |
| | Black colorant | Organic pigment A | | | |
| | | Inorganic pigment A | | | |
| | | MnFe | 10.5 | | |
| | | TiN | | 7.7 | |
| | | Carbon black | | | 7 |
| | Polymerization initiator A | | 6 | 6 | 6 |
| | (meth)acryloyloxy group-containing compound | Compound A | 300 | 300 | 300 |
| | | Compound B | 300 | 300 | 300 |
| | | Compound C | | | |
| | Saccharide A | | | | |
| | Surfactant A | | 0.01 | 0.01 | 0.01 |
| Evaluation | pattern formation at film thickness of 2 μm | | OK | NG | NG |
| | pattern formation at film thickness of 10 μm | | NG peeling | NG | NG |
| | resolution | | peeling | 50 | 50 |
| | pattern shape | | D | C | C |
| | O D | | 2 | 2 | 2 |

In the table:
Acrylic polymer A: "R.N-081F" (Natoco Co., Ltd.)
Organic pigment A: a mixture of pigment orange and pigment blue (Tokyo Chemical Industry Co., Ltd.); the organic pigment A was added after dispersed in a dispersant "DisperBYK-2000" (BYK Chemie); $R_{365/500}$ = 1.3
Inorganic pigment B: "NITBLACK UB-1" (Mitsubishi Materials Corporation); $R_{365/500}$ = 4.0
MnFe: JFE Chemical Corporation; $R_{365/500}$ = 0.4
TiN: Mitsubishi Materials Corporation; $R_{365/500}$ = 0.7
Carbon black: BASF; $R_{365/500}$ = 0.3
Polymerization initiator A: "Irgacure OXE-02" (BASF)
Compound A: dipentaerythritol hexaacrylate ("A-DPH", Shin-Nakamura Chemical Co., Ltd.)
Compound B: polyethylene glycol #600 diacrylate ("A-600", Shin-Nakamura Chemical Co., Ltd.)
Compound C: 2-hydroxy-3-acryloyloxypropyl methacrylate ("701A", Shin-Nakamura Chemical Co., Ltd.)
Saccharide: sucrose ethylene oxide adduct
Surfactant A: "AKS-10" (Shin-Etsu Chemical Co., Ltd.).

Each of the obtained compositions was applied onto a silicon wafer by spin coating, and after the application, the coated film was prebaked on a hot plate at 100° C. for 90 seconds so as to prepare an average film thickness of 2 μm or 10 μm. Exposure was performed using an i-line exposure machine, development was performed using a 2.38% TMAH aqueous solution or 0.025% KOH, and rinsing with pure water was performed for 30 seconds. As a result, it was confirmed whether or not a 10 μm contact hole (C/H) pattern was formed. The obtained results are as shown in Tables 1 and 2. In all Examples, it was confirmed that the pattern was formed (OK). In Example 20, although the pattern was formed, it was observed to be slightly peeled off (peeling) at an average film thickness of 10 μm. In Comparative Example 1, when the average film thickness was 10 μm, the resolution was not measured because the pattern was not formed (NG) and peeled off (peeling). In Comparative Examples 2 and 3, when the average film thickness was 2 μm and 10 μm, pattern was not formed (NG).

When the average film thickness was 10 μm, the resolution was defined as the minimum mask size through which a contact hole was confirmed to be formed by an optical microscope (MX61A-F, Olympus Corporation). The obtained results are as described in Tables 1 and 2.

The mask size and the pattern width when a 10 μm pattern size was formed at the above average film thickness of 10 μm were compared by cross-sectional observation using an SEM, and evaluated as follows. The obtained results are as described in Tables 1 and 2.

A: The difference between the pattern width and the mask size is within 5%.
B: The difference between the pattern width and the mask size is more than 5% and within 10%.
C: The difference between the pattern width and the mask size exceeds 10%.
D: The pattern is peeled off or the pattern is floating from the substrate.

Each composition was applied onto a glass plate to form a coated film having an average thickness of 10 μm. After baking the coated film at 230° C. for 30 minutes in the air, the transmittance at the wavelength of 400 to 700 nm was measured using a Spectrophotometer CM-5 (Konica Minolta, Inc.), and it was converted into the OD.

The invention claimed is:

1. A negative type photosensitive composition comprising (I) a polysiloxane comprising a repeating unit represented by the formula (Ia'):

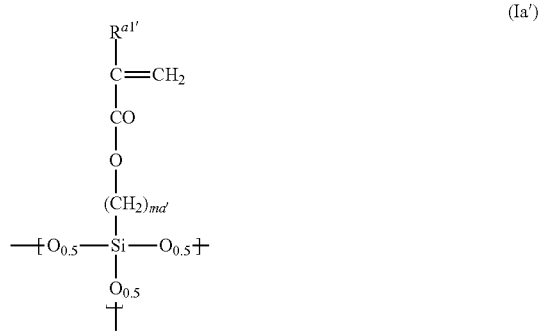

wherein,
$R^{a1'}$ is hydrogen or methyl; and
ma' is each independently an integer of 1 to 6, (II) a black colorant,
(III) a polymerization initiator, and
(IV) a solvent,
wherein the black colorant (II) has a transmittance ratio represented by [transmittance at the wavelength of 365 nm]/[transmittance at the wavelength of 500 nm] of 1.2 or more.

2. The composition according to claim 1, wherein the polysiloxane comprises a repeating unit represented by the formula (Ia):

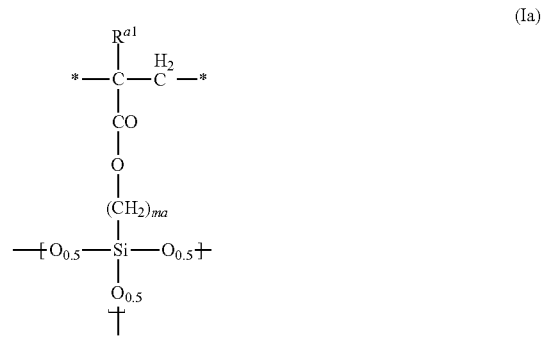

wherein,
$R^{a1}$ is hydrogen or methyl; and
ma is each independently an integer of 1 to 6, and
an acrylic polymerization unit represented by the formula (a):

wherein,
$R^{a2}$ is each independently hydrogen or methyl;
$R^{a3}$ is hydrogen, a monovalent to hexavalent, $C_{1-50}$ hydrocarbon group, wherein one or more methylene in the hydrocarbon group can be replaced by oxy, imino and/or carbonyl, and when $R^{a3}$ is multivalent, $R^{a3}$ connects carbonyloxy in the formula (a) with carbonyloxy contained in another repeating unit represented by the formula (a); and
na is an integer of 0 or more, and
wherein,
* of at least one repeating unit in the formula (Ia) is connected, directly or via an acrylic polymerization unit represented by the formula (a), to * of another repeating unit represented by the formula (Ia).

3. The composition according to claim 1, wherein the content of the black colorant is 3 to 80 mass % based on the total mass of the alkali-soluble resin.

4. The composition according to claim 1, further comprising a compound containing two or more (meth)acryloyloxy groups (V).

5. The composition according to claim 1, wherein the content of the compound containing two or more (meth)

acryloyloxy groups (V) is 5 to 1,000 mass based on the total mass of the alkali-soluble resin (I).

6. The composition according to claim 1, further comprising a saccharide (VI).

7. A method for producing a cured film comprising applying the composition according to claim 1 onto a substrate to form a coating film, exposing the coating film, and developing.

8. A cured film produced by the method according to claim 7.

9. The cured film according to claim 8, wherein the average film thickness is 5 to 100 μm.

10. The cured film according to claim 8, wherein the optical density (OD) is 2 or more.

11. A display device comprising the cured film according to claim 8.

* * * * *